US009057801B2

(12) United States Patent
Jiang et al.

(10) Patent No.: US 9,057,801 B2
(45) Date of Patent: Jun. 16, 2015

(54) GEOPHYSICAL DATA ACQUISITION SYSTEM

(75) Inventors: John Jiang, Houston, TX (US); Azizuddin Abdul Aziz, Houston, TX (US); Ying Liu, Houston, TX (US); Kurt-M. Strack, Houston, TX (US)

(73) Assignee: KJT ENTERPRISES, INC., Houston, TX (US)

( * ) Notice: Subject to any disclaimer, the term of this patent is extended or adjusted under 35 U.S.C. 154(b) by 579 days.

(21) Appl. No.: 13/347,775

(22) Filed: Jan. 11, 2012

(65) Prior Publication Data

US 2013/0176821 A1      Jul. 11, 2013

(51) Int. Cl.
*G01V 1/00* (2006.01)
*G01V 11/00* (2006.01)
*H03M 1/12* (2006.01)
*G01V 1/16* (2006.01)
(Continued)

(52) U.S. Cl.
CPC ............... *G01V 11/00* (2013.01); *H03M 1/124* (2013.01); *H03M 1/1255* (2013.01); *H03M 1/129* (2013.01); *G01D 3/022* (2013.01); *G01V 1/164* (2013.01); *G01V 1/22* (2013.01)

(58) Field of Classification Search
CPC ........... G01V 1/30; G01V 1/22; G01V 1/223; G01V 1/003; G01V 1/28; G01V 1/00; G01V 1/008; G01V 1/306; G01V 1/308; G01V 1/325; G01V 1/364; G01V 1/3808; G01V 1/005
USPC ......... 324/350, 365; 340/3.1, 3.7; 367/59–60, 367/66–67, 76–80; 702/1, 14–15, 47, 702/75–79, 91; 181/122
See application file for complete search history.

(56) References Cited

U.S. PATENT DOCUMENTS 4,039,806 A * 8/1977 Fredriksson et al. .......... 708/276
RE31,559 E * 4/1984 Carter .............................. 367/76
4,628,493 A * 12/1986 Nelson et al. .................... 367/79
(Continued)

FOREIGN PATENT DOCUMENTS

WO       2004001455 A1    12/2013

OTHER PUBLICATIONS

Notification of transmittal of the international search report and the written opinion of the international searching authority from International Application No. PCT/US2012/069398, dated Aug. 23, 2013.
(Continued)

*Primary Examiner* — Isam Alsomiri
*Assistant Examiner* — Amienatta M Ndure Jobe
(74) *Attorney, Agent, or Firm* — Richard A. Fagin; Adenike Adebiyi

(57) ABSTRACT

A geophysical data acquisition system includes at least one geophysical sensor. The at least one geophysical sensor has associated therewith a signal generator configured to generate a signal corresponding to a type of the at least one geophysical sensor. The system includes at least one signal acquisition unit having a plurality of input channels. The at least one geophysical sensor is in signal communication with one of the plurality of input channels. The plurality of input channels each includes a detector for receiving and identifying the signal generated by the signal generator. The at least one signal acquisition unit includes amplification, filtering and digitizing circuits automatically configurable in response to the type of sensor identified by the detected signal.

19 Claims, 6 Drawing Sheets

(51) Int. Cl.
*G01V 1/22* (2006.01)
*G01D 3/02* (2006.01)

(56) References Cited

U.S. PATENT DOCUMENTS

| | | | |
|---|---|---|---|
| 4,944,036 A * | 7/1990 | Hyatt | 367/43 |
| 5,918,194 A | 6/1999 | Banaska et al. | |
| 5,920,828 A * | 7/1999 | Norris et al. | 702/14 |
| 6,236,212 B1 * | 5/2001 | Wynn | 324/365 |
| 6,786,297 B1 * | 9/2004 | Menard | 181/112 |
| 7,009,533 B1 * | 3/2006 | Wegener | 341/76 |
| 7,088,276 B1 * | 8/2006 | Wegener | 341/155 |
| 7,453,763 B2 * | 11/2008 | Johnstad | 367/20 |
| 7,773,457 B2 | 8/2010 | Crice et al. | |
| 8,026,723 B2 | 9/2011 | Loehken et al. | |
| 8,148,992 B2 * | 4/2012 | Kowalczyk et al. | 324/365 |
| 2005/0177310 A1 * | 8/2005 | Duncan et al. | 702/14 |
| 2010/0244811 A1 * | 9/2010 | Pupalaikis et al. | 324/76.23 |

OTHER PUBLICATIONS

Strack, K.-M., 1992, Exploration with Deep Transient Electromagnetics—Introduction and Indexes: Elsevier Science Publishers B. V., Amsterdam.

* cited by examiner

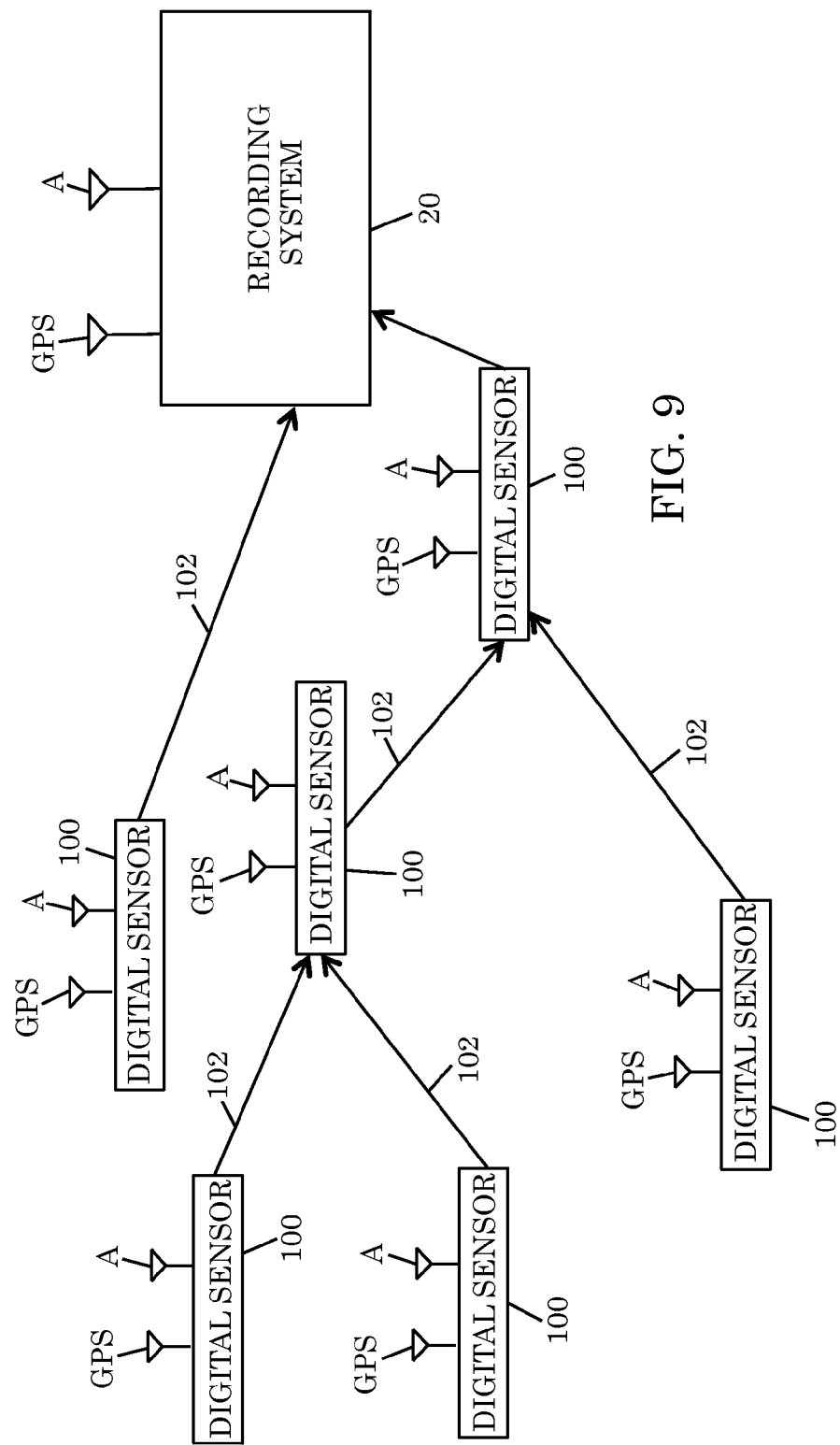

GEOPHYSICAL DATA ACQUISITION SYSTEM

BACKGROUND

The invention relates generally to the field of geophysical data acquisition. More particularly, the invention relates to geophysical data acquisition systems that may use a single type of acquisition and signal processing device with a plurality of different types of geophysical sensors.

U.S. Pat. No. 8,026,723 issued to Loehken et al. describes a marine electromagnetic and seismic sensing cable system. The described system includes one or more acquisition units disposed along the sensing cable. The unit(s) include a number of separate signal inputs that are connected to various types of geophysical sensors, for example, magnetometers, magnetic field amplitude sensors, seismic particle motion sensors, seismic pressure or pressure gradient sensors and electric field sensors. Each signal input may have circuitry that is specific to the type of sensor coupled thereto. Output of the circuitry may be multiplexed to an analog to digital converter. Digitized signal measurements may be conducted to a recording unit and/or to a data storage device. The disclosed system requires that a specific type of geophysical sensor to be coupled to a signal input have the required circuitry for such sensor. Thus, the types of sensors that may be used and their electrical and mechanical configuration may be limited.

There is a need for a more flexible acquisition system that may be used with a plurality of different sensors while simplifying and standardizing the circuitry used to process signals from the various geophysical sensors.

SUMMARY

One aspect of the invention is a geophysical data acquisition system. A geophysical data acquisition system according to this aspect of the invention includes at least one geophysical sensor. The at least one geophysical sensor has associated therewith a signal generator configured to generate a signal corresponding to a type of the at least one geophysical sensor. The system includes at least one signal acquisition unit having a plurality of input channels. The at least one geophysical sensor is in signal communication with one of the plurality of input channels. The plurality of input channels each includes a detector for receiving and identifying the signal generated by the signal generator. The at least one signal acquisition unit includes amplification, filtering and digitizing circuits automatically configurable in response to the type of sensor identified by the detected signal.

Other aspects and advantages of the invention will be apparent from the description and claims which follow.

BRIEF DESCRIPTION OF THE DRAWINGS

FIG. 9 shows an example where the sensors are digital sensors. The digitization is done proximate the sensors, and in some examples processing and data storage plus network adaption to wireless or cable telemetry and GPS synchronization may be performed. The digital sensor may be connected by cable or wireless with the data recording system or in some instances directly to the network.

DETAILED DESCRIPTION

Figure 1:
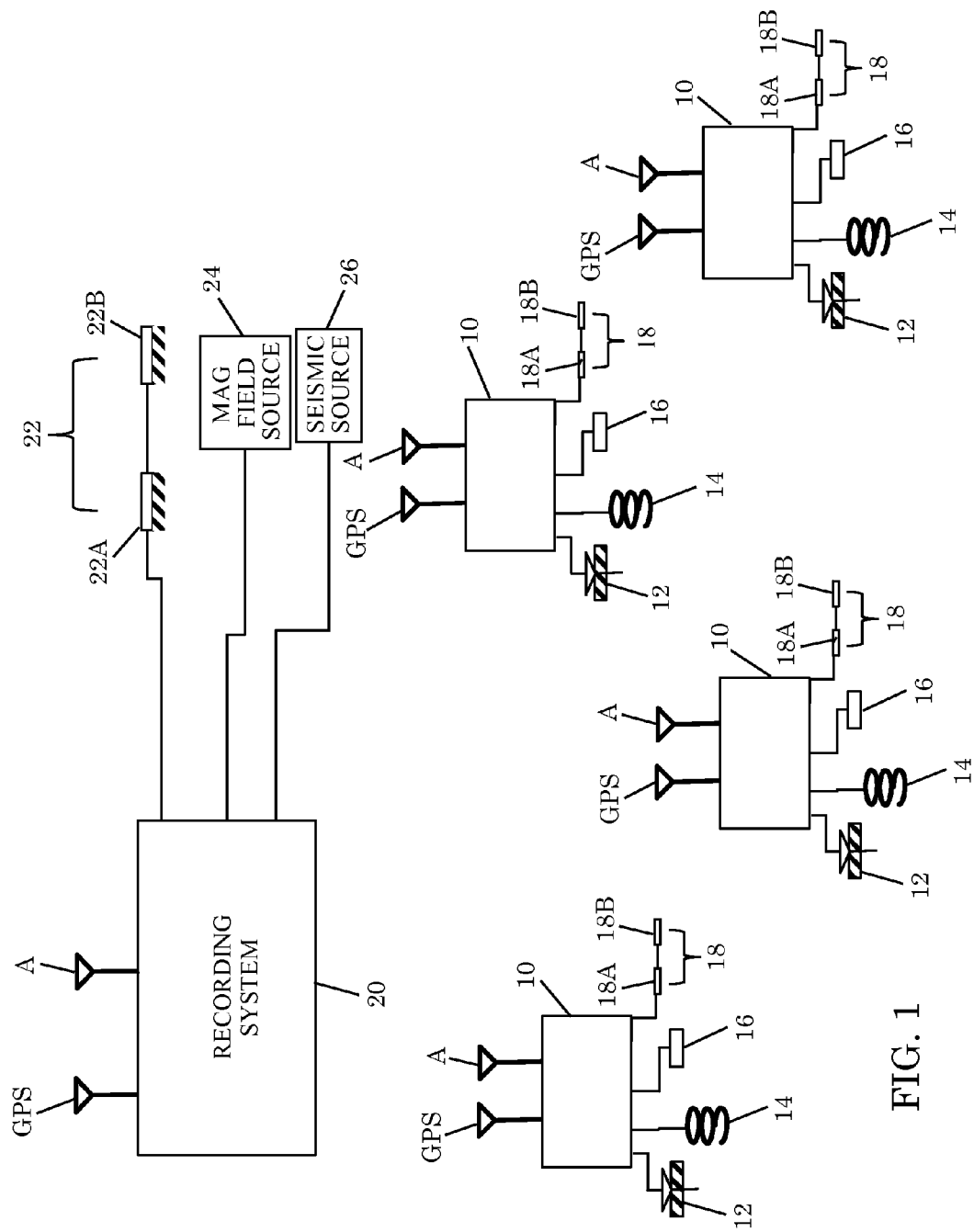
FIG. 1 shows a schematic view of a geophysical acquisition system according to the invention, including a plurality of data acquisition units.

An example geophysical data acquisition system is shown schematically in plan view in FIG. 1. The example geophysical data acquisition system may include a data recording system 20 having components (not shown separately) for operating a seismic energy source 26 such as a vibrator at selected times. The recording system 20 may also include components (not shown separately) to control operation of one or more electromagnetic field transmitters, for example, an electric field transmitter 22 comprising spaced apart electrodes 22A, 22B in electrical contact with the ground or a body of water for marine geophysical surveying. In addition or alternatively, the recording system 20 may control operation of a magnetic field transmitter 24, such as a wire coil disposed proximate the ground surface or in or on the bottom of a body of water for marine operations. Electromagnetic fields may be imparted into Earth formations in the subsurface by passing electric current through one or more types of the foregoing electromagnetic transmitters. For example, passing electric current across the electrodes 22A, 22B will induce an electric field. If the electric current is time varying, a time varying electromagnetic field will be imparted into the subsurface. The electric current across the electrodes 22A, 22B may be varied in amplitude by one or more discrete frequencies (e.g., in the form of a sine wave) for frequency domain electromagnetic surveying, or the electric current may include one or more current switching events to induce transient electromagnetic fields in the subsurface for time domain electromagnetic surveying. Non-limiting examples of switching events include switching current on, switching current off, reversing current polarity and switching current in a coded sequence such as a pseudorandom binary sequence (PRBS).

The recording system 20 may include radio communication equipment (not shown separately) for transmitting command signals to and receiving data signals from one or more signal acquisition units 10 disposed at selected positions proximate the ground surface or in a body of water. Radio communication may be performed using a system such as one disclosed in U.S. Pat. No. 7,773,457 issued to Crice et al. and incorporated herein by reference. A radio transceiver antenna A may be provided for such communication on the recording unit 20. The recording unit 20 may have its operation synchronized to an absolute time reference, for example a global positioning system (GPS) satellite signal. The recording system 20 may include a global positioning system signal receiver antenna GPS for such purpose. Radio communication may also include various forms of wireless data transmission protocols such as BLUETOOTH® wireless technology standard or any of the IEEE 802.11, IEEE 802.15 protocols.

A plurality of the signal acquisition units 10 may be deployed at selected locations above an area of the Earth's subsurface to be surveyed. Each signal acquisition unit 10 may include a radio communication antenna A and a global positioning system signal receiver antenna GPS for communication with the recording system 20 and for detecting an absolute time reference signal from the global positioning system signal. Each signal acquisition unit 10 may have various types and numbers of geophysical sensors coupled to input channels of each signal acquisition unit 10, as will be explained in more detail with reference to FIG. 2. For example, a seismic particle motion sensor 12 (either single component or multiple component) may be in contact with the ground surface, suspended in a body of water or deployed on the water bottom to detect either or both naturally occurring seismic signals or signals produced in response to operation of the seismic energy source 26. The seismic particle motion sensor 12 may detect seismic energy that is naturally occurring or is produced in response to actuation of the seismic energy source 26. Other types of sensors that can be used may include magnetometers 14, magnetic field amplitude sensors 16 (in the form of wire loops or coils, fluxgate sensors or the like), and electric field sensors 18 such as spaced apart electrodes 18A, 18B (in the form of galvanic electrodes, capacitive electrodes or the like) in contact with the ground or a body of water or bottom thereof for marine survey operations. The types and configurations of geophysical sensors described herein are only examples and are not intended to limit the scope of the invention.

Figure 2:
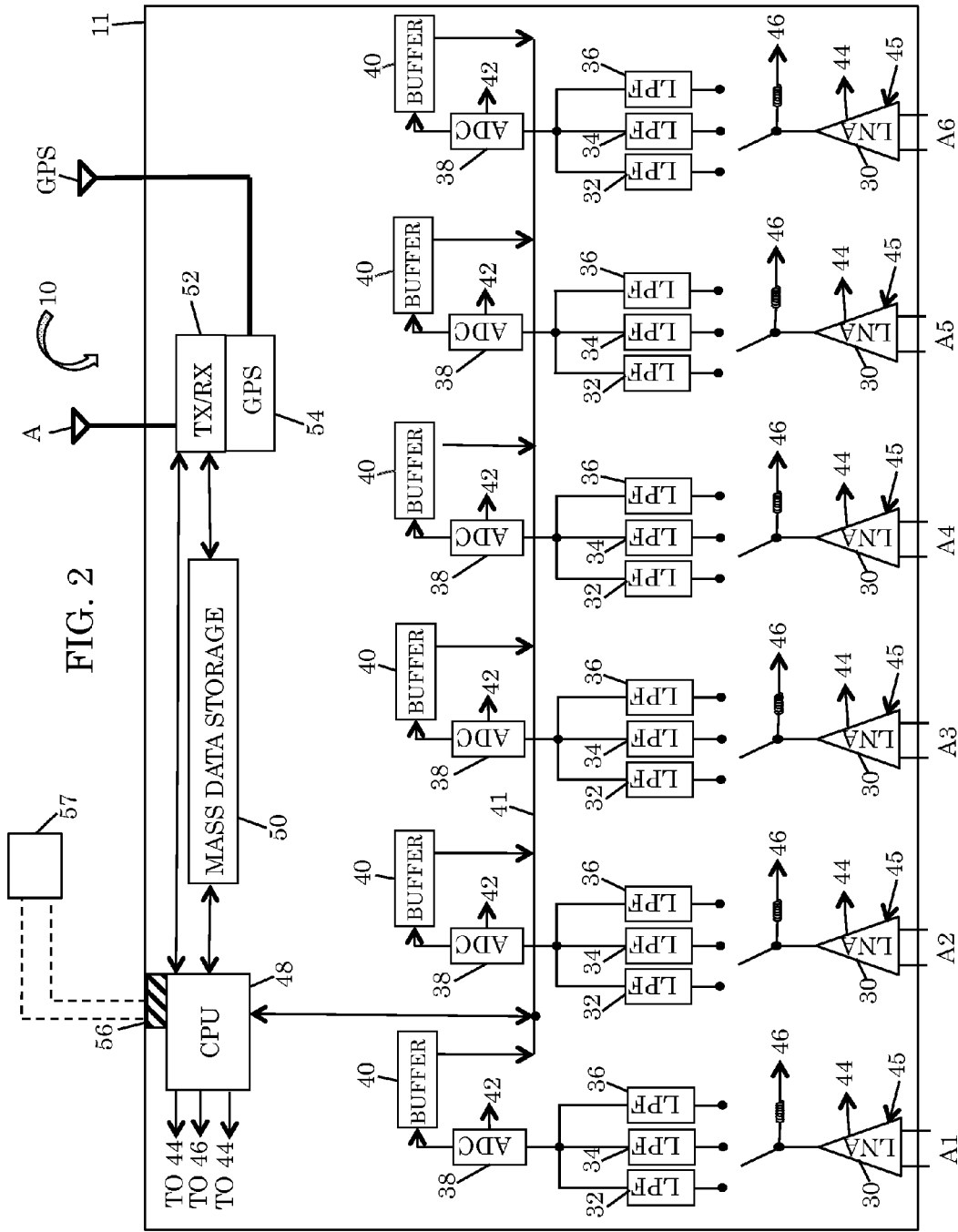
FIG. 2 shows a data acquisition unit from FIG. 1 in more detail.

A functional block diagram of an example signal acquisition unit 10 is shown in FIG. 2. The components of the signal acquisition unit 10 may be disposed inside a weather proof or pressure resistant housing 11. The housing 11 may include a plurality of weather proof and/or pressure proof input connectors A1 through A6. The input connectors conduct signals input from a respective geophysical sensor (explained below with reference to FIGS. 3 and 4), an electrical cable (not shown in FIG. 2) from which may be coupled to one of the input connectors A1-A6 (e.g., see connection links between sensors 12, 14, 16, 18 and signal acquisition units 10 in FIG. 1). Electrical terminals of each connector A1-A6 may be coupled to input of a low noise, programmable gain amplifier 30. Gain of each programmable gain amplifier 30 may be selected by applying an appropriate control signal to a gain control input 44, as will be further explained below. For convenience, the connectors A1-A6, corresponding programmable gain amplifiers 30 and corresponding further circuitry (including low pass filters and an analog to digital converter-explained below) may be referred to as "input channels."

The output of each programmable gain amplifier 30 may be coupled to a respective electromechanical (e.g., operated by a solenoid 46) or electronic switch S. Each switch S may be configured to selectively couple the output of the respective programmable gain amplifier 30 to a particular low pass filter 32, 34, 36, and then to a respective analog to digital converter (ADC) 38. Each switch S may also directly couple the respective programmable gain amplifier 30 output to the input of the respective ADC 38. The low pass filters 32, 34, 36 may be selected to filter the output of the programmable gain amplifier 30 depending on the type of geophysical sensor (FIG. 1) coupled to the respective analog signal input at the connector A1-A6.

Each ADC 38 may be a 24-bit resolution, programmable sample rate device, such as are obtainable from Texas Instruments, Dallas Tex. The sample rate of each ADC may be selected to correspond to the highest expected frequency signal input from the corresponding programmable gain amplifier and low pass filter, depending on the type of sensor in signal communication with the input channel. Digitized sensor signal output from each ADC 38 may be conducted to a respective buffer 40 for temporary storage thereof until the digitized signals may be conducted to a mass data storage device 50, such as a hard drive or solid-state memory. A central processing unit (CPU) 48 such as a microcontroller may provide signals to select the gain of each programmable gain amplifier 30, may select the low pass filter 32, 34, 36 for each programmable gain amplifier 30 and may cause the contents of each buffer 40 to be written to the mass data storage unit 50 (e.g., via signal bus 41). A transceiver 52 may communicate the digitized sensor signals using any wireless or radio transceiver protocol, e.g., BLUETOOTH® wireless technology standard, IEEE 802.11 (b), (g) or (n) or IEEE 802.15. An absolute time reference may be obtained from a global positioning system (GPS) signal receiver 54. The transceiver 52 and the GPS receiver 54 may each have a respective antenna A, GPS.

Figure 3:
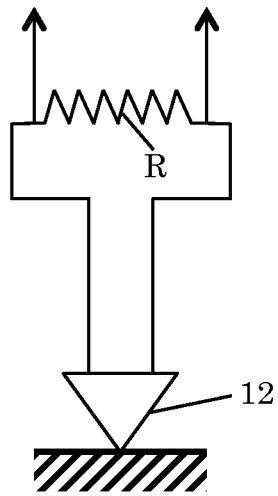
FIG. 3 shows an example of one type of sensor including a coding element.

The central processor 48 may interrogate the type of sensor through two dedicated control/receiving lines, e.g., through a respective control terminal 45 to interrogate the coding input of a sensor. A signal with specific input level detected on the input may indicate the type of sensor coupled to the respective input connector A1-A6. Referring to FIG. 3, one type of device for generating a signal corresponding to the type of sensor is a sensor-specific resistor R. In the example shown in FIG. 3, a resistor R having a predetermined resistance may be associated with a specific type of sensor, for example, a seismic sensor 12. When the central processor (48 in FIG. 2) detects a specific value of resistance associated with a seismic sensor 12 or other type of sensor, the central processor (48 in FIG. 2) may send a control signal to adjust the gain of the respective programmable gain amplifier (30 in FIG. 2) to correspond to the input signal associated with the specific type of sensor. The central processor (48 in FIG. 2) may also send a control signal to the corresponding switch (S in FIG. 2) to select a corresponding low pass filter (32, 34, 36 in FIG. 2). The low pass filters (32, 34, 36 in FIG. 2) may be implemented as analog filters, or may be controllable digital filters as will be explained with reference to FIG. 6. Non-limiting examples of high-cut frequencies for the low pass filters (32, 34, 36 in FIG. 2) may include 10 Hz, 1 KHz and 20 KHz.

Returning to FIG. 2, the central processor 48 may also send a control signal to each ADC 38, through a control terminal 42 thereon to select the digital sample rate of each ADC 38. The sample rate of each ADC 38 may be selected to correspond to the type of sensor coupled to the respective input connector A1-A6. Such sample rate selection may be automatic based on the type of sensor determined to be coupled the respective input connector A1-A6 when the central processor 48 interrogates each input (e.g., through the terminal 45 on each amplifier 30).

The central processor 48 may also include an input terminal 56 for a data storage device 57, for example, an SD card or external hard drive. Such data storage device 57 may include preprogrammed instructions for the central processor 48 to operate certain of the input channels to have a preselected digital sample rate, low pass filter high cut frequency and programmable amplifier gain. The storage device 57 may also include instructions for predetermined data recording start times and stop times for each input channel depending on the configuration of the acquisition system (e.g., as shown in FIG. 1), and may include digital representations of signal waveforms to cause the central processor 48 to operate a digital to analog converter, as will be explained with reference to FIG. 7.

Figure 4:
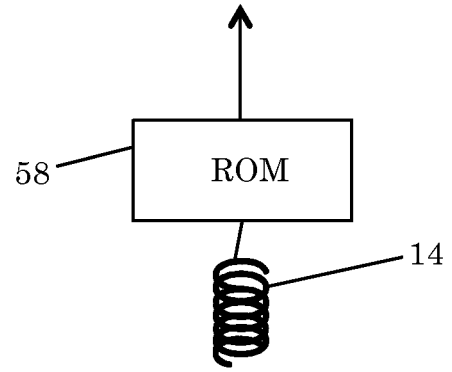
FIG. 4 shows another example sensor including a different type of coding element.

Referring to FIG. 4, in another example, a digital signal generator, such as a read-only memory (ROM) 58 may be in signal communication with the output of the respective sensor, e.g., a magnetometer 14 in the present example. The ROM 58 may be programmed to send a selected digital word corresponding to the type of sensor. Such digital word may be communicated to the central processor (48 in FIG. 2), which in response will send a control signal to the respective programmable amplifier gain control terminal 44 to select an amplifier gain corresponding to the type of sensor coupled to the programmable gain amplifier input. The central processor (48 in FIG. 2) may operate the respective switch (S in FIG. 2) to select the appropriate low pass filter (32, 34, 36 in FIG. 2) for the type of sensor connected to the respective input terminal (A1 through A6 in FIG. 2). The central processor (48 in FIG. 2) may also send a control signal to the respective ADC (38 in FIG. 2) to select a digital sample rate suitable for the type of sensor coupled to the respective input channel.

Figure 5:
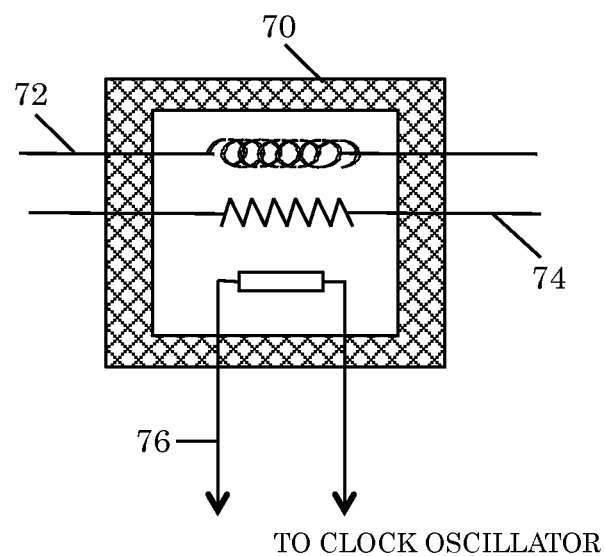
FIG. 5 shows an example of a temperature-controlled crystal for a clock oscillator.

FIG. 5 shows an oscillator crystal 76 disposed in a thermally insulated chamber 70. The chamber 70 may be disposed inside the data acquisition unit housing (11 in FIG. 2) and may include therein an electric heating element 72 and a temperature sensor 74 in signal communication with the central processor (48 in FIG. 2). The central processor (48 in FIG. 2) may provide a control signal to operate the heating element 72 in response to temperature as measured by the temperature sensor 74 so that a substantially constant temperature is maintained inside the chamber 70. Thus, thermal drift in the crystal frequency may be minimized. The crystal 76 may be used to operate a clock oscillator, for example, forming part of the central processor (48 in FIG. 2). In the event the signal acquisition unit (10 in FIG. 2) is positioned so that no global positioning system signal is detectable, the clock oscillator may maintain a substantially constant clock signal for identifying the absolute acquisition time of each digital sample generated by each ADC (38 in FIG. 2). A clock forming part of the central processor (48 in FIG. 1) may be synchronized with a clock in the recording unit (20 in FIG. 1) during system deployment, and the clock forming part of the processor may operate using the temperature controlled crystal 76 as a frequency reference during periods of time when an absolute time reference signal is not available.

Figure 6:
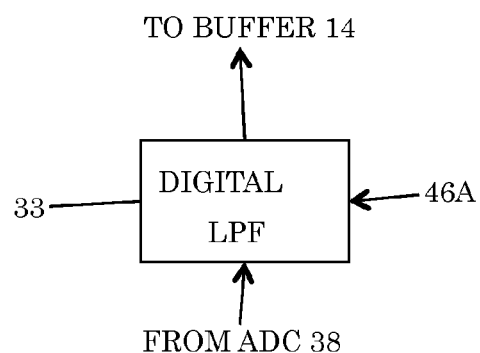
FIG. 6 shows an example digital low pass filter.

FIG. 6 shows an example of a digital low pass filter (LPF) 33, which may be any type of digital signal filter known in the art. The cutoff frequency of the digital LPF 33 may be selected by a control signal applied to a control terminal 46A in response to a signal therefor generated by the central processor (48 in FIG. 2). The digital LPF 33 may be connected between the output of the ADC (38 in FIG. 2) and the input to the buffer (40 in FIG. 2). When using the foregoing digital LPF configuration, the sample frequency of the ADC (38 in FIG. 2) should be set to avoid aliasing in the digital output thereof (i.e., at least twice the maximum frequency of the respective analog signal input to the respective low noise programmable gain amplifier (30 in FIG. 2).

Figure 7:
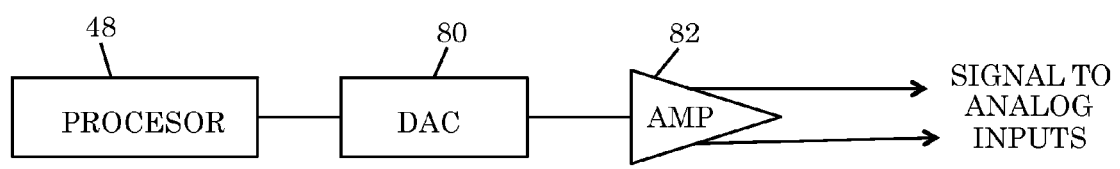
FIG. 7 shows an example signal generator forming part of a data acquisition unit shown in FIG. 2.

FIG. 7 shows an example of a signal generator that may form part of the data acquisition unit (10 in FIG. 2). The central processor 48 may have stored therein, or may receive from the data storage device (e.g., 57 in FIG. 2), if used, a digital representation of one or more signal waveforms. Such waveforms may include direct current (DC), and any selected alternating current (AC) waveform, including but not limited to discrete frequency sine waves and various current transient switching event waveforms. The digital waveform representation may be conducted to a digital to analog converter (DAC) 80. Output of the DAC 80 may be conducted to a power amplifier 82. Output of the power amplifier 82 may be coupled to any one or more of the input channels. The foregoing may provide the data acquisition unit (10 in FIG. 2) with the following capabilities. Each input channel can be multiplexed to the signals generated by the DAC 80. Any signal waveform can be generated by the firmware to feed into input channel for calibration and function verification purposes. Output of the DAC 80 can also be used for noise cancelation, such as 60 Hz and 50 Hz power line noise. The input channels can be sampled by the central processor (48 in FIG. 2) and the waveform conducted to the DAC 80 can be adjusted to output the same sampled waveform, but with reversed polarity to reduce the noise. Using the foregoing feature, higher gain can be selected for each programmable gain amplifier (30 in FIG. 2) to measure small amplitude signals and thereby improve the signal to noise ratio from each input channel.

Arbitrary or random signals may also be generated to drive a magnetometer if coupled to an input channel which has a calibration input function. The random signal can be used for calibration or verification of the magnetometer output as well as specific signals that are locked into the noise and feed back into the sensor in such a way that they compensate for the noise. For a magnetometer this could be, for example, but limited to a current in the form of a calibration winding, phase locked to periodic noise, polarity reversed and than amplified such that the periodic noise is minimum at the sensor output. For any other sensor that is linear, for example but not limited to electrodes one can sample a number of noise cycles. Subsequently the noise can be analyzed and feedback into the sensor externally such that the output of the sensors shows a minimum amount of noise. As the largest sources of noise are most often periodic and vary slowly with respect to signal time (see, e.g, Strack, K.-M., 1992, *Exploration with Deep Transient Electromagnetics—Introduction and Indexes:* Elsevier Science Publishers B. V., Amsterdam) only a small number of noise cycles are needed to compensate the noise in near real time. Subsequently compensations will converge quickly due to the limited changeability of periodic noise, which is mostly caused by power line systems. The circuitry can be further optimized based on such understanding of periodic noise sources The foregoing devices shown in FIG. 7 may also be used to generate a DC offset voltage to compensate for bias voltage that may exist across an input channel when an electric field sensor is used (e.g., electrodes 18A, 18B shown in FIG. 1). Input channels determined by the central processor to have an electric field sensor coupled thereto (e.g., as explained with reference to FIGS. 3 and 4) may have voltages measured as explained with reference to FIG. 2 in the absence of any electromagnetic field being imparted into the subsurface, that is, any electromagnetic transmitter is not operating. Voltage bias measured across the electric field sensor (18 in FIG. 1) may be substantially canceled by application of an inverse (offset) voltage thereto using the devices shown in FIG. 7, or substantially similar devices that may be coupled to each input channel. If another type of sensor is detected as coupled to a particular input channel, the central processor may be programmed not to apply a DC offset.

Figure 8:
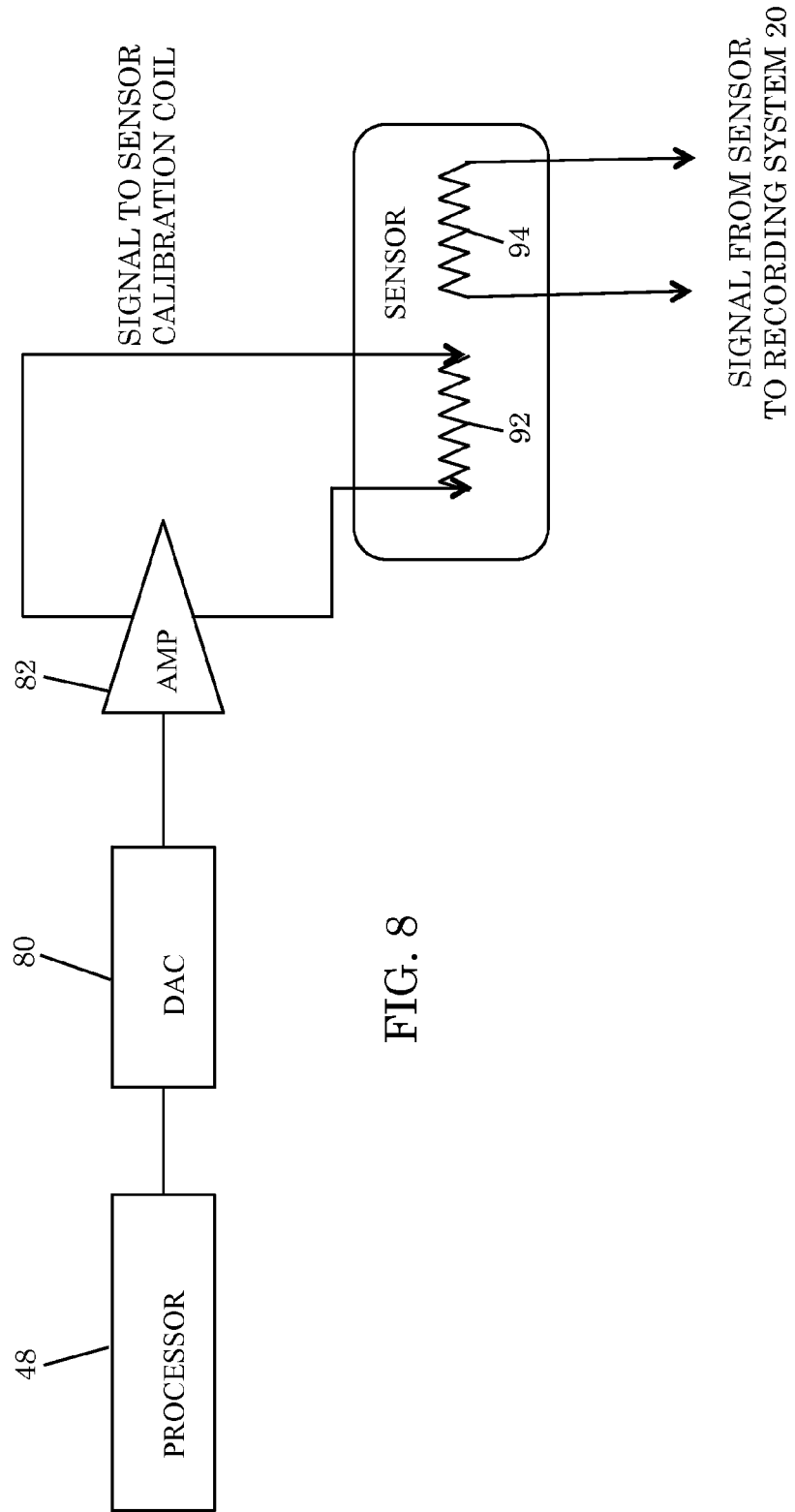
FIG. 8 shows an example of the processor controlling digital-to-analog-converter and subsequently an amplifier circuit to control a noise compensation feedback in the sensor unit. Here, as an example a magnetic sensor is shown. Similar configurations can be made for an electric field or seismic sensor.

FIG. 8 shows the forgoing device where a digital-to-analog channel (DAC) 80 receives a command from the processor 48 based on various compensation algorithms such that it feeds a predefined analog signal into the compensation part of the data acquisition unit. In the case of a magnetometer the analog signal can be provided by a calibration winding or an additional winding both represented by 92 in FIG. 8. An external winding is also possible as long as the resulting noise on the sensor output is lower than without such winding. For other types of sensor other compensation techniques are possible as long as the cause aforementioned noise reduction takes place. Such compensation may reduce the noise and significantly improve signal-to-noise ration without any phase distortion in the signal fidelity.

An additional benefit may be to reduce processing time required to reduce the signal to noise ratio or to reduce transmitter power requirements when the unit is used to record a controlled source signal similar to the type described by Strack, 1992. It may also be advantageous to couple the analogue feedback with digital feedback such as but not limited too where the remaining noise portion of a previous signal window is subtracted from its consecutive window such that the noise is reduced to almost zero.

A data acquisition unit and a geophysical data acquisition system using such data acquisition units as described herein may have one or more of the following advantages. The signal acquisition unit may use any type of geophysical sensor coupled to any of the input channels, and the acquisition unit will automatically configure it so that amplification, filtering and digitization are optimized for the particular type of sensor coupled to such input channel. All the input channels may be identical, which enables use of the data acquisition unit for general-purpose applications. In the case where the input channels are variable, such as is common in magnetotelluric prospecting wherein electric and magnetic fields are acquired, or in cases where seismic and/or electromagnetic sensors are mixed, each sensor maybe codes as to the sensor type and/or category, or in case of digital sensors as uniquely identified sensors. This allows the appropriate calibration data to be either merged with acquired signal data. Time saving and data reductions results.

A mesh network may be used for transmitting geophysical survey measurements from the data acquisition unit to the recording unit substantially in real-time for data quality analysis and checking. The acquisition unit may have an internal digital to analog converter to enable compensation for external voltage offsets. The data acquisition unit may have a digital sampling rate up to 100 kHz to cover high frequency signals e.g., up to 50 kHz. By matching amplification, digitization rate and sample recording rate to the particular sensor type, the example data acquisition unit may combine both low frequency and high frequency sampled input channels, providing minimized power consumption with respect to the required data quality for each sensor type. Identification of sensor and noise compensation feedback shown in FIG. 8 further reduces power consumption and may provide a balanced system The data acquisition timing may be synchronized with a global positioning system signal absolute time reference; an absolute time signal can be sent from the recording unit to any data acquisition unit in the absence of a detectable time reference (e.g., GPS) signal. The acquisition timing may also be provided in such circumstances by a temperature stabilized clock oscillator crystal. The data acquisition unit may automatically re-synchronize to an absolute time reference when a time reference signal, e.g., GPS signal is once again detectable by the data acquisition unit.

When using digital sensors, the already digitized data output therefrom may be sent to the recording system 20 as shown in FIG. 9. The digital sensors 100 can produce at least digital data which can then be transmitted to the recording system 20 either by wired or wireless connection 102 or stored on a memory device (not show separately in FIG. 9)

In some instances, where noise considerations allow, the digital sensor 100 may already include all the functions of the recording system 20 including network adaption. For magnetic field sensors this requires very careful shielding and grounding design as memory write action can be ready by magnetic sensors. Magnetic sensors include magnetic field and seismic sensors. Being able to realize this with such array architecture allows minimizing system noise and allows signal from noise splitting by allowing parallel signal amplification in a balanced mode with low power consumption. This allows significant cost and size reduction of highly specialize geophysical acquisition systems.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A geophysical data acquisition system, comprising:
   at least one geophysical sensor, the at least one geophysical sensor having associated therewith a signal generator configured to generate a signal corresponding to a type of the at least one geophysical sensor; and
   at least one signal acquisition unit having a plurality of input channels, the at least one geophysical sensor in signal communication with one of the plurality of input channels, the plurality of input channels each including a central processor for receiving the signal generated by the signal generator and identifying the type of sensor associated with the received signal, the at least one signal acquisition unit including amplification, filtering and digitizing circuits automatically configurable in response to the type of sensor identified by the detected signal.

2. The geophysical data acquisition system of claim 1 wherein the signal generator comprises a coded resistor.

3. The geophysical data acquisition system of claim 1 wherein the signal generator comprises a read only memory.

4. The geophysical data acquisition system of claim 1 wherein the amplification circuit comprises a programmable gain amplifier.

5. The geophysical data acquisition system of claim 1 wherein the filtering circuit comprises a plurality of analog low pass filters, a one of the plurality of low pass filters selectably connected between the amplification circuit and the digitizing circuit based on the detected signal.

6. The geophysical data acquisition system of claim 1 wherein the filtering circuit comprises a digitally controlled filter connected between the amplification circuit and the digitizing circuit, a cutoff frequency of the digitally controlled filter selected based on the detected signal.

7. The geophysical data acquisition system of claim 1 wherein the digitization circuit comprises a selectable sample rate analog to digital converter, a sample rate of the analog to digital converter selected based on the detected signal.

8. The geophysical data acquisition system of claim 1 wherein the at least one geophysical sensor comprises at least one of a seismic sensor, an electric field sensor, a magnetic field amplitude sensor and a magnetometer.

9. The geophysical data acquisition system of claim 1 further comprising an absolute time reference signal receiver associated with the at least one signal acquisition unit, an absolute time signal detected by the absolute time reference signal receiver used to synchronize signal detection by the at least one geophysical sensor with respect to absolute time.

10. The geophysical data acquisition system of claim 1 further comprising a clock oscillator associated with the at least one geophysical signal acquisition unit, the clock oscillator connected to an oscillator crystal disposed in a temperature-controlled chamber.

11. The geophysical data acquisition system of claim 1 further comprising a waveform generator associated with the at least one geophysical signal acquisition unit, the waveform generator configured to generate current having a selected waveform, the waveform generator in signal communication with at least one of the input channels.

12. The geophysical data acquisition system of claim 11 wherein the waveform generator is configured to detect selected types of noise in signals communicated by the at least one geophysical sensor, the waveform generator configured to generate a waveform corresponding to an inverse of the selected type of noise and apply the inverse to the input channel associated with the at least one geophysical sensor.

13. The geophysical data acquisition system of claim 12 wherein the selected type of noise comprises at least one of 50 Hertz power line noise and 60 Hertz power line noise.

14. The geophysical data acquisition system of claim 12 wherein the selected type of noise comprises a bias voltage present on an electric field sensor.

15. The geophysical data acquisition system of claim 1 wherein the at least one geophysical signal acquisition unit comprises a radio transceiver for communicating digitized sensor signals to a recording system disposed at a selected location separate from the at least one geophysical signal acquisition unit.

16. The geophysical data acquisition system of claim 15 further comprising a plurality of geophysical signal acquisition units each comprising a radio transceiver, wherein the radio transceivers form part of a mesh network for communication of digitized data signals to the recording system.

17. The geophysical data acquisition system of claim 1 wherein the at least one geophysical signal acquisition unit comprises a central processor configured to operate the amplification, filtering and digitizing circuits.

18. The geophysical data acquisition system of claim 17 wherein the central processor further comprises an input connectible to a data storage device, the data storage device comprising instructions coded thereon for predetermined operation of the amplification, filtering and digitizing circuits associated with each of the plurality of input channels.

19. The geophysical data acquisition system of claim 1 wherein acquisition unit control feedback circuitry to the sensors generate an external compensation signal in the sensors simulating noise, and further comprising feedback configured to minimize the noise.

* * * * *